(12) United States Patent
Miura

(10) Patent No.: US 11,542,602 B2
(45) Date of Patent: Jan. 3, 2023

(54) SUBSTRATE PROCESSING APPARATUS AND SUBSTRATE PROCESSING METHOD

(71) Applicant: Tokyo Electron Limited, Tokyo (JP)

(72) Inventor: Yoshitaka Miura, Oshu (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 0 days.

(21) Appl. No.: 16/938,468

(22) Filed: Jul. 24, 2020

(65) Prior Publication Data

US 2021/0023677 A1 Jan. 28, 2021

(30) Foreign Application Priority Data

Jul. 26, 2019 (JP) .............................. JP2019-138211

(51) Int. Cl.
| | | |
|---|---|---|
| C23C 16/455 | (2006.01) | |
| C23C 16/56 | (2006.01) | |
| C23C 16/44 | (2006.01) | |
| H01J 23/10 | (2006.01) | |
| H01L 21/67 | (2006.01) | |
| B24B 57/02 | (2006.01) | |

(52) U.S. Cl.
CPC .... *C23C 16/45578* (2013.01); *C23C 16/4401* (2013.01); *C23C 16/45563* (2013.01); *C23C 16/56* (2013.01); *B24B 57/02* (2013.01); *C23C 16/45544* (2013.01); *C23C 16/45546* (2013.01); *H01J 23/10* (2013.01); *H01L 21/67069* (2013.01)

(58) Field of Classification Search
CPC .......... C23C 16/45578; C23C 16/4401; C23C 16/45563; C23C 16/45544; C23C 16/45546

See application file for complete search history.

(56) References Cited

U.S. PATENT DOCUMENTS 4,062,318 A * 12/1977 Ban .................... C23C 16/45506
                                                                118/724
6,328,221 B1 * 12/2001 Moore .............. C23C 16/45563
                                                                118/715

(Continued)

FOREIGN PATENT DOCUMENTS

| JP | 2010-114391 A | 5/2010 |
|---|---|---|
| JP | 2016-096220 A | 5/2016 |
| JP | 2018056232 A | 4/2018 |

*Primary Examiner* — Jeffrie R Lund
(74) *Attorney, Agent, or Firm* — Nath, Goldberg & Meyer; Jerald L. Meyer; Tanya E. Harkins

(57) ABSTRACT

A substrate processing apparatus includes: a processing container; an injector provided inside the processing container and having a shape extending in a longitudinal direction along which a processing gas is supplied; a holder fixed to the injector; a first magnet fixed to the holder and disposed inside the processing container; a second magnet separated from the first magnet by a partition plate and disposed outside the processing container; and a driving part configured to rotate the second magnet, wherein the first magnet and the second magnet are magnetically coupled to each other, and wherein by rotating the second magnet by the driving part, the first magnet magnetically coupled to the second magnet is rotated, and the injector rotates about the longitudinal direction as an axis.

6 Claims, 14 Drawing Sheets

(56) References Cited

U.S. PATENT DOCUMENTS

| | | | |
|---|---|---|---|
| 6,347,749 B1* | 2/2002 | Moore | C23C 16/45563 |
| | | | 427/248.1 |
| 2003/0044533 A1* | 3/2003 | Lee | C23C 16/509 |
| | | | 427/255.28 |
| 2007/0123007 A1* | 5/2007 | Furutani | C30B 25/14 |
| | | | 427/248.1 |
| 2012/0231158 A1* | 9/2012 | Ueno | G11B 5/85 |
| | | | 118/500 |
| 2017/0137942 A1* | 5/2017 | Kikuchi | C23C 16/4409 |
| 2018/0087156 A1* | 3/2018 | Fukushima | C23C 16/45578 |
| 2019/0093230 A1* | 3/2019 | Fukushima | C23C 16/45546 |
| 2020/0102652 A1* | 4/2020 | Nagata | C23C 16/4584 |
| 2021/0017646 A1* | 1/2021 | Miura | C23C 16/45578 |
| 2021/0023677 A1* | 1/2021 | Miura | H01L 21/67069 |
| 2021/0123138 A1* | 4/2021 | Choi | C23C 16/4583 |

* cited by examiner

SUBSTRATE PROCESSING APPARATUS AND SUBSTRATE PROCESSING METHOD

CROSS-REFERENCE TO RELATED APPLICATION(S)

This application is based upon and claims the benefit of priority from Japanese Patent Application No. 2019-138211, filed on Jul. 26, 2019, the entire contents of which are incorporated herein by reference.

TECHNICAL FIELD

The present disclosure relates to a substrate processing apparatus and a substrate processing method.

BACKGROUND

There is known a batch-type substrate processing apparatus, which is capable of performing, for example, a film forming process on a plurality of substrates in a state where the substrates are held in multiple stages by a substrate holder in a processing container.

In the batch-type substrate processing apparatus, an injector is provided along an inner wall of the processing container, and a horizontal portion of the L-shaped injector is inserted and fixed in a through-hole formed in a lower end flange of the processing container. In addition, in a vertical portion of the injector, a plurality of gas ejection ports is provided along a direction in which the substrates are stacked (i.e., a vertical direction), and further, a mechanism for rotating the injector is provided.

PRIOR ART DOCUMENT

Patent Document

Patent Document 1: Japanese laid-open publication No. 2018-56232

SUMMARY

According to an aspect of the present disclosure, a substrate processing apparatus includes: a processing container; an injector provided inside the processing container and having a shape extending in a longitudinal direction along which a processing gas is supplied; a holder fixed to the injector; a first magnet fixed to the holder and disposed inside the processing container; a second magnet separated from the first magnet by a partition plate and disposed outside the processing container; and a driving part configured to rotate the second magnet, wherein the first magnet and the second magnet are magnetically coupled to each other, and wherein by rotating the second magnet by the driving part, the first magnet magnetically coupled to the second magnet is rotated, and the injector rotates about the longitudinal direction as an axis.

BRIEF DESCRIPTION OF DRAWINGS

The accompanying drawings, which are incorporated in and constitute a part of the specification, illustrate embodiments of the present disclosure, and together with the general description given above and the detailed description of the embodiments given below, serve to explain the principles of the present disclosure.

DETAILED DESCRIPTION

Figure 1:
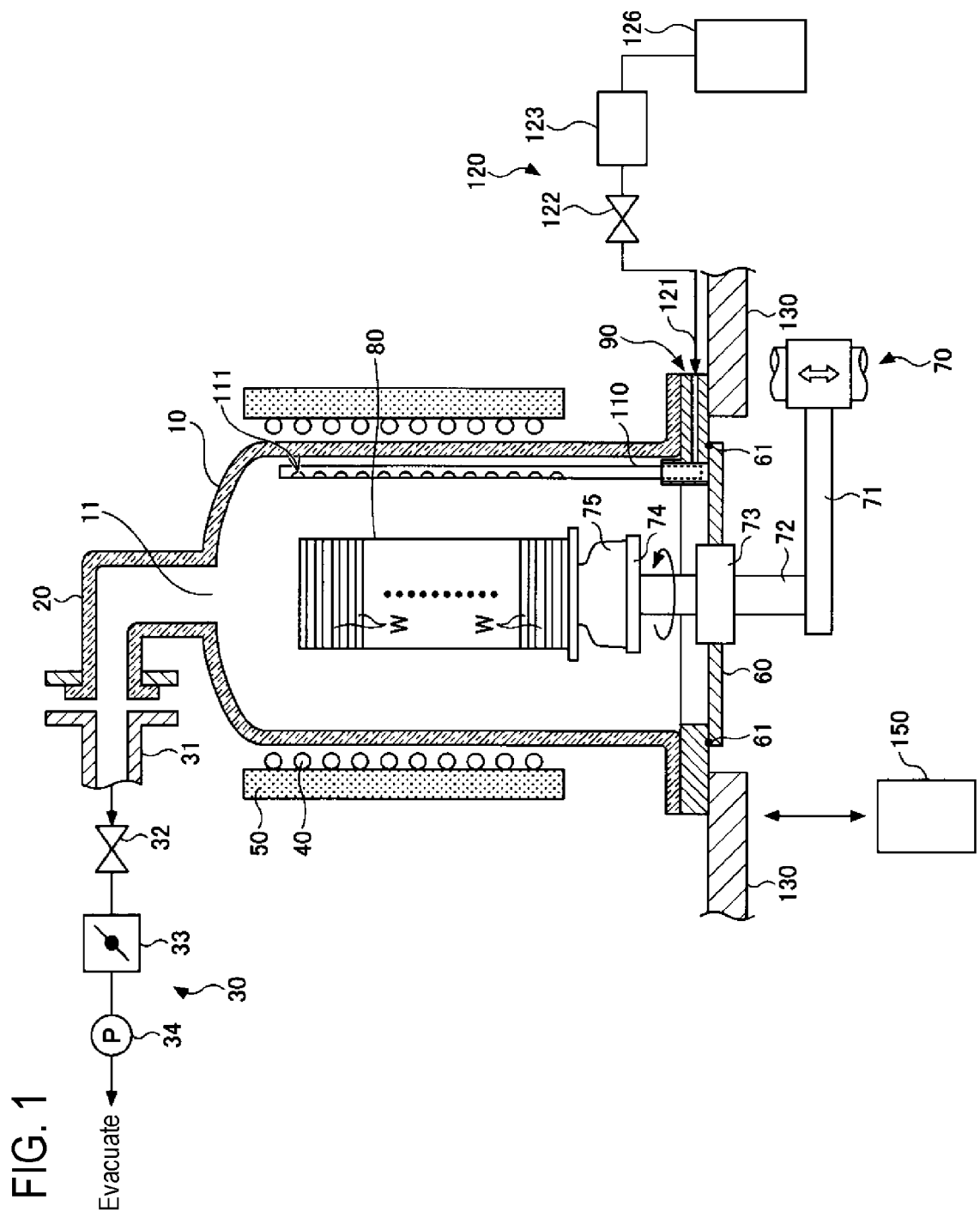
FIG. 1 is a schematic view illustrating configuration of a substrate processing apparatus according to a first embodiment.

Reference will now be made in detail to various embodiments, examples of which are illustrated in the accompanying drawings. In the following detailed description, numerous specific details are set forth in order to provide a thorough understanding of the present disclosure. However, it will be apparent to one of ordinary skill in the art that the present disclosure may be practiced without these specific details. In other instances, well-known methods, procedures, systems, and components have not been described in detail so as not to unnecessarily obscure aspects of the various embodiments.

Exemplary embodiments will be described below. The same members or the like will be denoted by the same reference numerals and redundant descriptions thereof will be omitted.

First Embodiment (Substrate Processing Apparatus)

A substrate processing apparatus according to a first embodiment will be described with reference to FIG. 1. However, an object to be processed and a processing content are not particularly limited, and the first embodiment is applicable to various processing apparatuses that supply a gas into a processing container to perform a substrate processing.

As illustrated in FIG. 1, a substrate processing apparatus according to the present embodiment has a processing container 10 that is capable of accommodating a semiconductor wafer (hereinafter, referred to as a "wafer W"). The processing container 10 is formed of quartz having a high heat resistance and has a substantially cylindrical body shape. The processing container 10 has an exhaust hole 11 in the ceiling thereof. The processing container 10 is formed in a vertical shape extending in a vertical (up-and-down) direction. The processing container 10 is formed to have a diameter of about 350 to 450 mm, for example, when a diameter of the wafer W to be processed is 300 mm.

A gas exhaust port 20 is connected to the exhaust hole 11 in the ceiling of the processing container 10. The gas exhaust port 20 has, for example, a quartz tube that extends upward from the exhaust hole 11 and is bent in an L shape at a right angle.

A vacuum exhaust system 30 for exhausting the interior of the processing container 10 is connected to the gas exhaust port 20. Specifically, the vacuum exhaust system 30 includes a metallic gas exhaust pipe 31 formed of, for example, stainless steel and connected to the gas exhaust port 20. In addition, an opening and closing valve 32, a pressure adjustment valve 33 such as a butterfly valve, and a vacuum pump 34 are sequentially provided in the middle of the gas exhaust pipe 31, so that an internal pressure of the processing container 10 can be adjusted while the interior of the processing container 10 is exhausted. The gas exhaust port 20 is formed to have the same inner diameter to that of the gas exhaust pipe 31.

A heating means 40 is provided on a side portion of the processing container 10 to surround the processing container 10. Thus, the wafer W accommodated in the processing container 10 can be heated. For example, the heating means 40 is divided into a plurality of zones, and is formed by a plurality of heaters (not illustrated) arranged side by side in the vertical direction and having individually controllable calorific values. The heating means 40 may be configured by a single heater without being divided into a plurality of zones. A heat insulator 50 is provided on the outer periphery of the heating means 40 to ensure thermal stability.

A lower end portion of the processing container 10 has an opening through which the wafer W can be loaded and unloaded. The opening at the lower end portion of the processing container 10 is opened and closed by a lid 60.

A wafer boat 80 is provided above the lid 60. The wafer boat 80 is a substrate holder configured to hold the wafer W, and is formed so as to be capable of holding a plurality of wafers W in a state in which the wafers W are spaced apart from one another in the vertical direction. The number of the wafers W held by the wafer boat 80 is not particularly limited, but may be, for example, 50 to 150 sheets.

The wafer boat 80 is placed on a table 74 via a heat insulation tube 75 formed of quartz. The table 74 is supported by an upper end portion of a rotary shaft 72 penetrating the lid 60 that opens and closes the lower end opening of the processing container 10. For example, a magnetic fluid seal 73 is provided in a penetrating portion of the rotary shaft 72 so as to rotatably support the rotary shaft 72 while hermetically sealing the rotary shaft 72. In addition, a seal member 61 such as an O-ring is provided on an outer peripheral portion of an upper surface of the lid 60 so that the interior of the processing container 10 can be sealed.

The rotary shaft 72 is attached to a tip end of an arm 71 supported by a lifting mechanism 70 such as a boat elevator, and is formed to be capable of integrally lifting the wafer boat 80 and the lid 60. The table 74 may be fixed to the lid 60 and the wafers W may be processed without rotating the wafer boat 80.

An annular manifold 90 is disposed at a lower end portion of the processing container 10. In addition, a required gas is introduced into the processing container 10 from the lower end portion of the processing container 10 via the manifold 90. Although the manifold 90 is configured as a component separate from the processing container 10, the manifold 90 may be provided integrally with the side wall of the processing container 10 to form a portion of the side wall of the processing container 10.

As described above, in the substrate processing apparatus according to the present embodiment, a space sealed by the processing container 10, the manifold 90, and the lid 60 is formed. In the present specification, a space surrounded by the processing container 10, the manifold 90, and the lid 60 may be referred to as the inside of the processing container 10 or an internal space of the processing container 10, and a space outside the processing container 10, the manifold 90, and the lid 60 may be referred to as the outside of the processing container 10. In the substrate processing apparatus according to the present embodiment, since the substrate processing is performed inside the processing container 10, the internal space of the processing container 10 is exhausted and a processing gas used for, for example, film formation, is supplied to the internal space of the processing container 10. The outside of the processing container 10 is in a substantially atmospheric pressure state.

The manifold 90 supports an injector 110. The injector 110 is a tubular member for supplying a gas into the processing container 10, and is formed of, for example, quartz. The injector 110 is formed in a shape extending in a longitudinal direction, and is installed in the processing container 10 such that the longitudinal direction matches the vertical direction. A plurality of gas holes 111 is formed in the injector 110 at predetermined intervals along the longitudinal direction such that the gas is ejected from the gas holes 111 in a horizontal direction. A single injector 110 may be provided, or a plurality of injectors 110 may be provided.

Figure 2A:
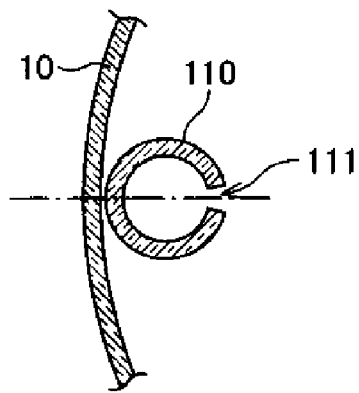
FIGS. 2A to 2C are explanatory views of an injector of the substrate processing apparatus according to the first embodiment.
Figure 2B:
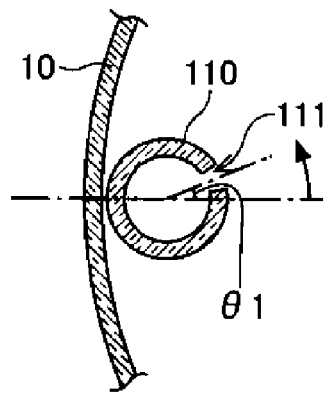
Figure 2C:
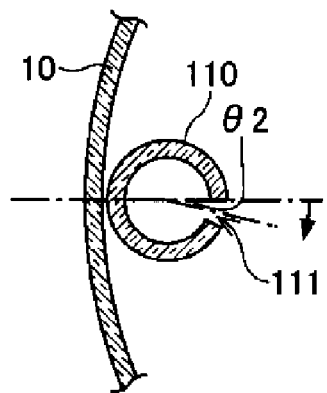

FIGS. 2A to 2C are explanatory views of the injector of the substrate processing apparatus of FIG. 1, and illustrate cross-sectional views taken along a line perpendicular to the longitudinal direction of the injector. In FIGS. 2A to 2C, a single injector 110 is illustrated as an example. FIG. 2A illustrates a state of the injector 110 at the origin position thereof. In addition, FIG. 2B illustrates a state of the injector 110 at a position rotated counterclockwise from the origin position by a predetermined angle θ1, and FIG. 2C illustrates a state of the injector 110 at a position rotated clockwise from the origin position by a predetermined angle θ2.

The injector 110 is configured to be rotatable both counterclockwise and clockwise by a rotary mechanism to be described later. Specifically, the injector 110 may be rotatable counterclockwise from the position where the gas holes 111 face the center of the processing container 10, as illustrated in FIG. 2A, to the position of the angle θ1, as illustrated in FIG. 2B. Further, the injector 110 may be rotatable clockwise to the position of the angle θ2, as illustrated in FIG. 2C. Then, by rotating the injector 110 while the gas is ejected from the gas holes 111 of the injector 110 in the horizontal direction, it is possible to control an in-plane distribution of the processing performed on the wafers W. The sum of the angle θ1 and the angle θ2 is, for example, 90 degrees.

As illustrated in FIG. 1, a gas supply system 120 for supplying a gas to the injector 110 is connected to the injector 110. The gas supply system 120 includes a gas pipe 121 formed of a metal such as stainless steel and in communication with the injector 110, and a gas cylinder 126 connected to the gas pipe 121. In addition, a flow rate controller 123 such as a mass flow controller, and an opening and closing valve 122 are sequentially provided in the middle of the gas pipe 121. Thus, it is possible to supply a processing gas supplied from the gas cylinder 126 while controlling the flow rate of the processing gas. Other processing gases necessary for processing the wafers W are also supplied via the gas supply system 120 and the manifold 90, which are configured as described above.

A peripheral portion of the manifold 90 at the lower end portion of the processing container 10 is supported by a base plate 130 formed of, for example, stainless steel, and the base plate 130 supports the load of the processing container 10. Below the base plate 130, a wafer transfer chamber having a wafer transfer mechanism (not illustrated) and a nitrogen gas atmosphere of approximately atmospheric pressure is provided. Above the base plate 130, a clean room having a clean air atmosphere is provided.

In addition, as illustrated in FIG. 1, a controller 150 that controls the entirety of the substrate processing apparatus is provided. The controller 150 controls operations of various devices in the substrate processing apparatus according to a recipe such that a process is performed under various process conditions indicated in the recipe. In addition, the controller 150 recognizes positions of the wafers W and the like by receiving signals from various sensors provided in the substrate processing apparatus, and performs a sequence control for advancing the process. In addition, the controller 150 may recognize a state of the substrate processing by receiving physical measurement values detected by various detectors provided in the substrate processing apparatus, and perform a feedback control and the like necessary for appropriately performing the substrate processing.

The controller 150 includes a calculation means and a storage means, such as a central processing unit (CPU), a read only memory (ROM), and a random access memory (RAM). The controller 150 may be configured as a microcomputer in which a program for processing a recipe is installed from a non-transitory storage medium storing the program, and which executes processing of the recipe. The controller 150 may be also configured as an electronic circuit such as an application specific integrated circuit (ASIC).

(Gas Introduction Mechanism)

Figure 3:
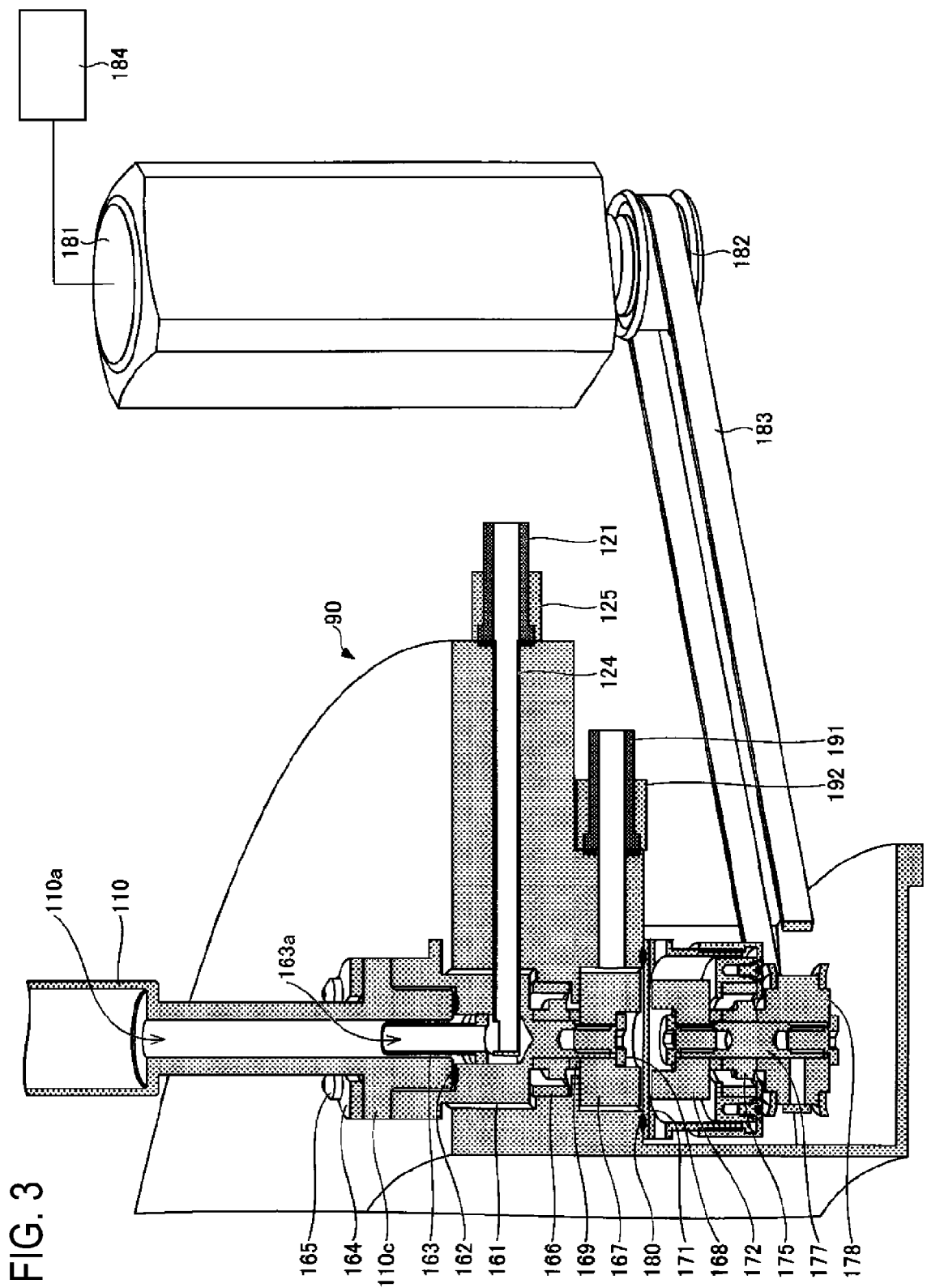
FIG. 3 is a perspective view including a cross section of a gas introduction mechanism of the substrate processing apparatus according to the first embodiment.
Figure 4:
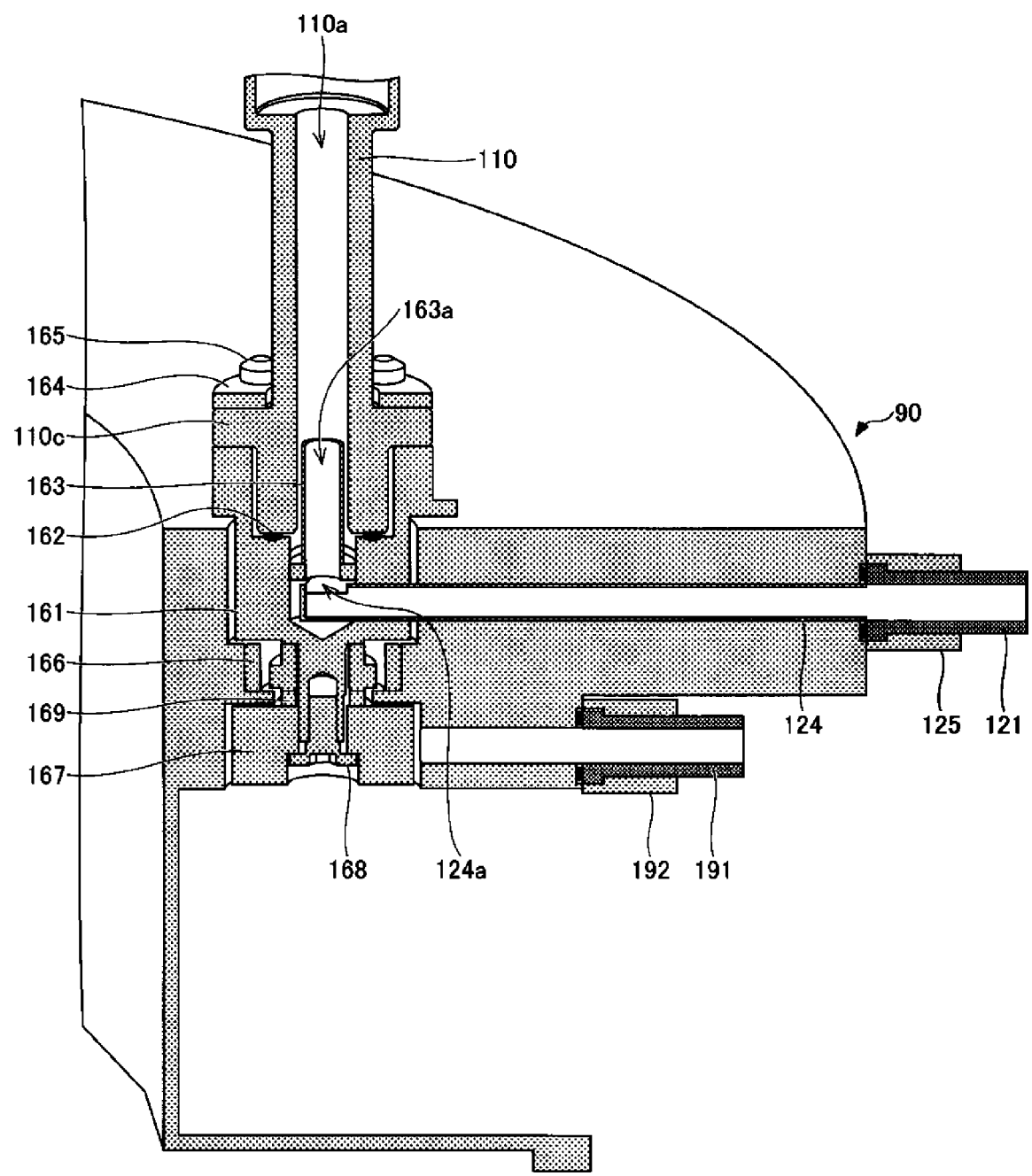
FIG. 4 is an explanatory view of an internal unit of the gas introduction mechanism according to the first embodiment.
Figure 5:
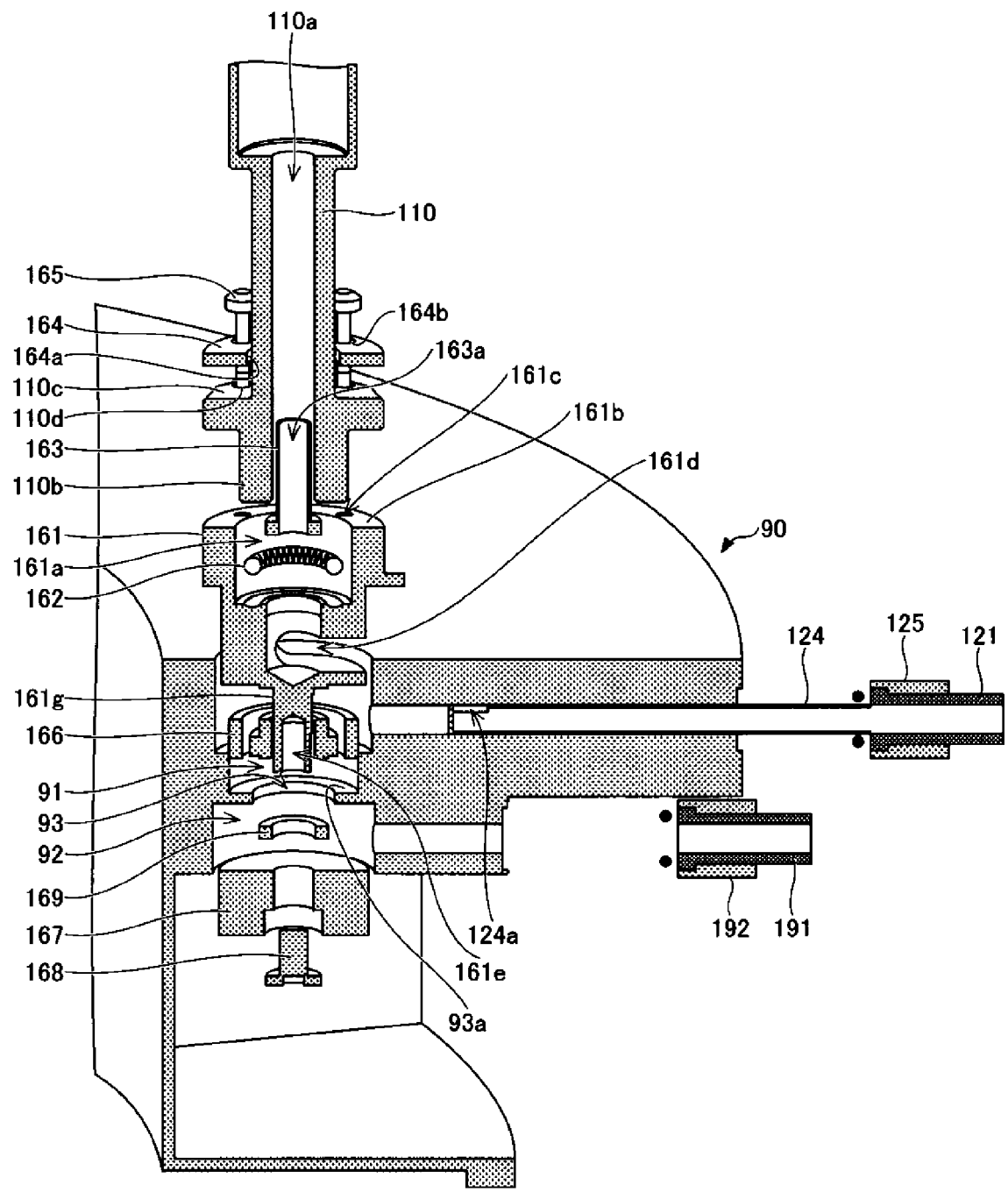
FIG. 5 is an explanatory view of the internal unit of the gas introduction mechanism according to the first embodiment.
Figure 6:
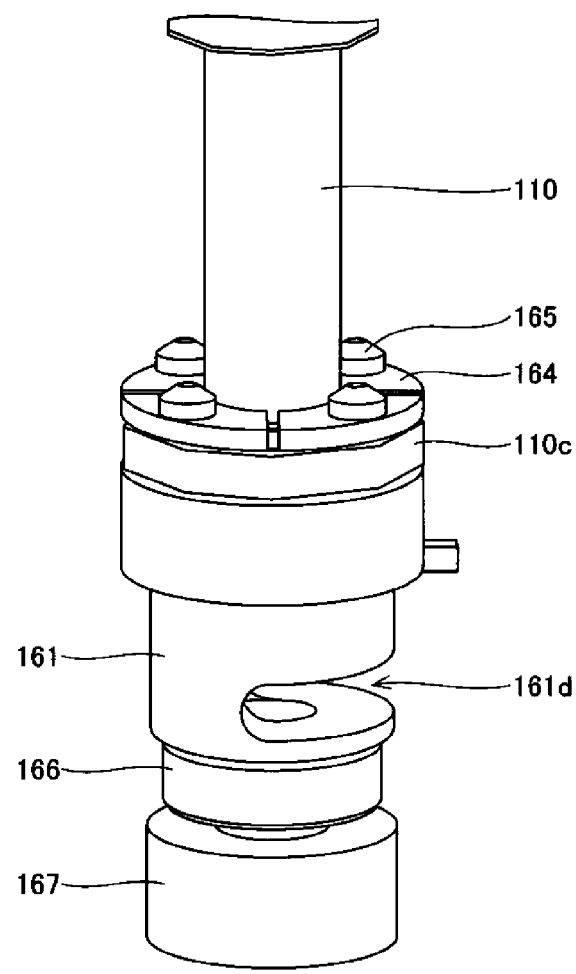
FIG. 6 is a perspective view of the internal unit of the gas introduction mechanism according to the first embodiment.
Figure 7:
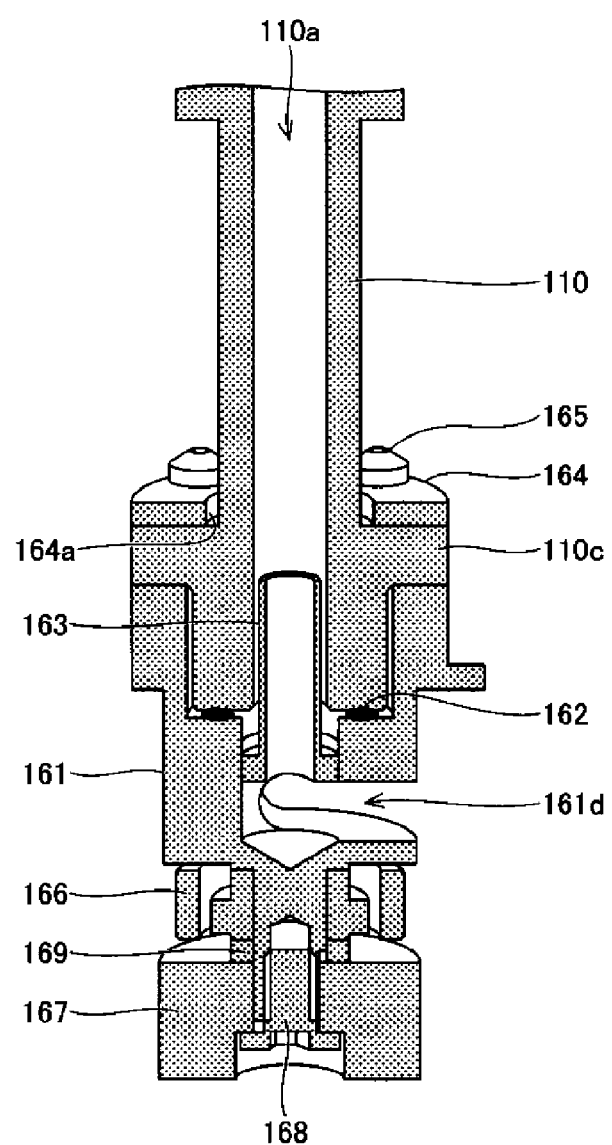
FIG. 7 is a perspective view including a cross section of the internal unit of the gas introduction mechanism according to the first embodiment.
Figure 8:
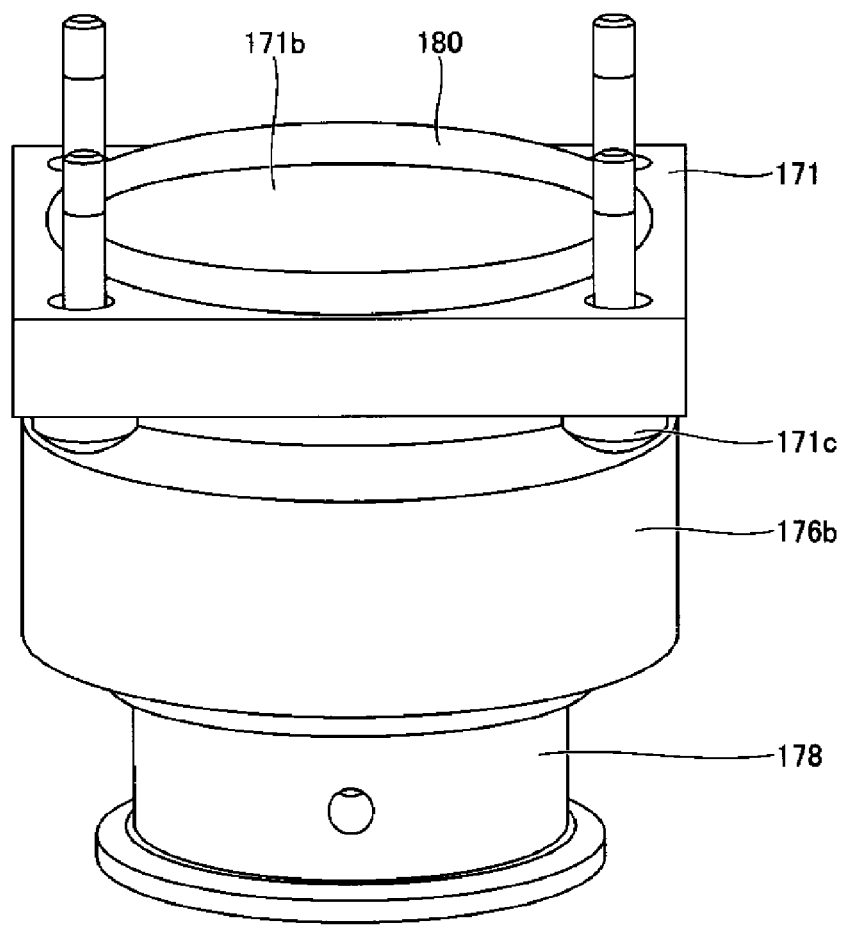
FIG. 8 is a perspective view of an external unit of the gas introduction mechanism according to the first embodiment.
Figure 9:
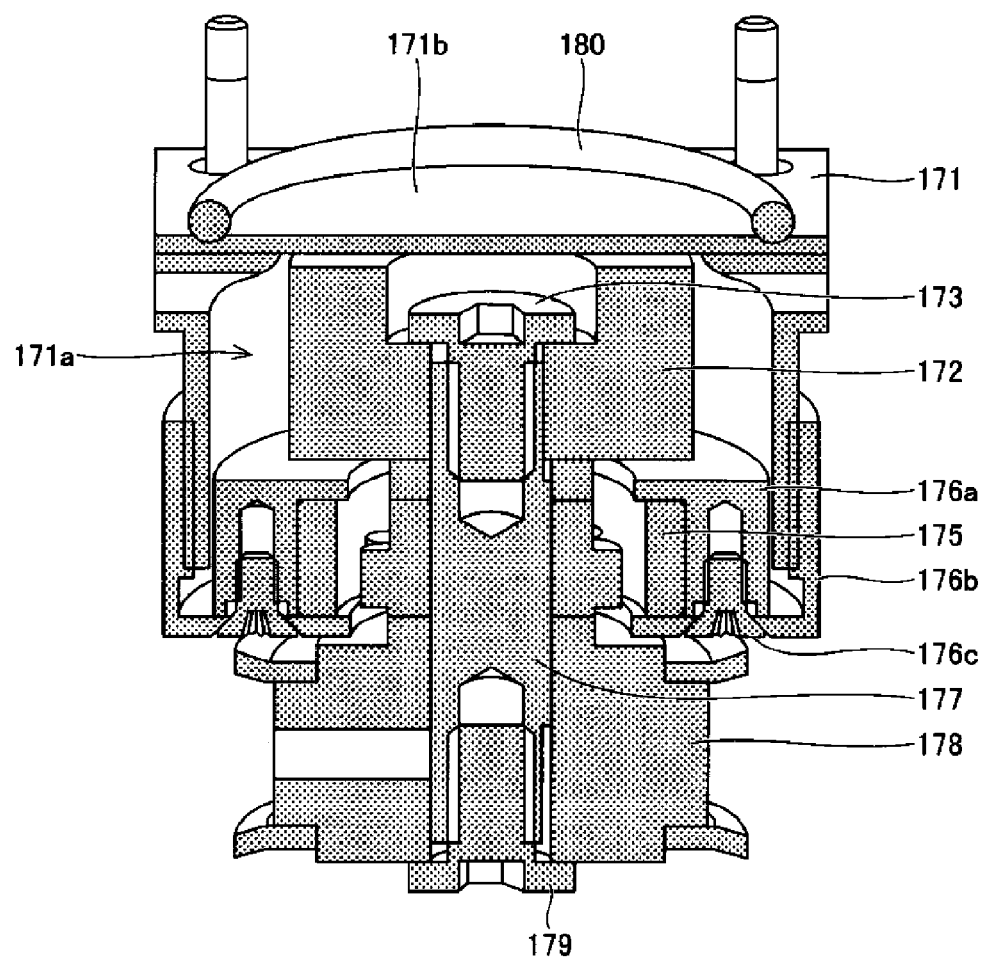
FIG. 9 is a perspective view including a cross section of the external unit of the gas introduction mechanism according to the first embodiment.
Figure 10:
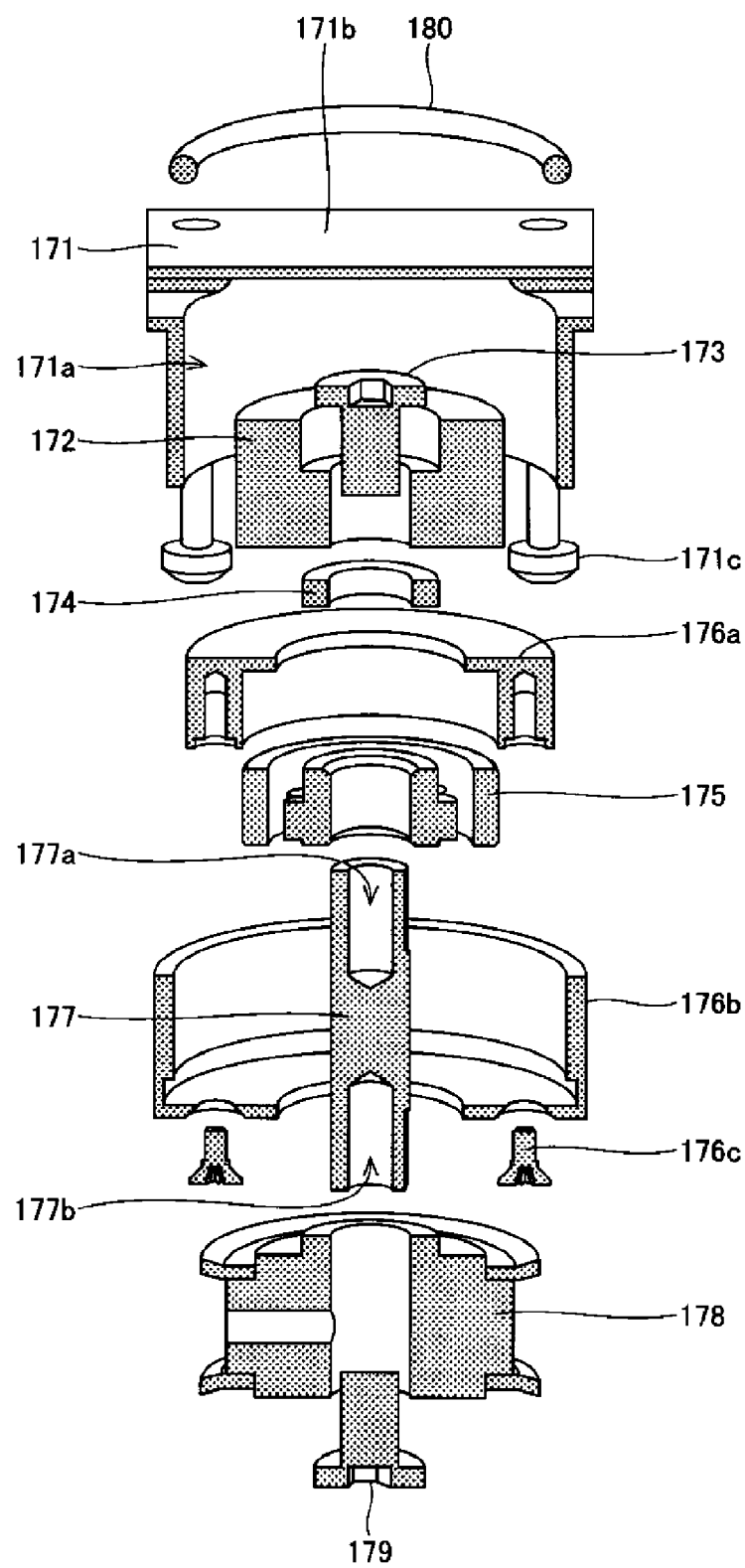
FIG. 10 is an explanatory view of the external unit of the gas introduction mechanism according to the first embodiment.

Next, a gas introduction mechanism of the substrate processing apparatus according to the present embodiment will be described in more detail with reference to FIGS. 3 to 10. FIG. 3 is a cross-sectional perspective view of the gas introduction mechanism of the substrate processing apparatus according to the present embodiment. FIG. 4 is a cross-sectional perspective view illustrating a state in which an internal unit of the gas introduction mechanism is installed, and FIG. 5 is a cut-out exploded perspective view in the state where the internal unit is installed. FIG. 6 is a perspective view of the internal unit, and FIG. 7 is a cut-out perspective view of the internal unit. FIG. 8 is a perspective view of an external unit of the gas introduction mechanism, FIG. 9 is a cross-sectional perspective view of the external unit of the gas introduction mechanism, and FIG. 10 is a cut-out exploded perspective view of the external unit.

First, the internal unit of the gas introduction mechanism will be described with reference to FIGS. 3 to 7.

In the substrate processing apparatus according to the present embodiment, an upper surface of the manifold 90 is provided with a circular upper opening 91, and a lower surface of the manifold 90 is provided with a circular lower opening 92 at a portion corresponding to the upper opening 91. In addition, the manifold 90 is provided with a bearing support 93a having a through-hole 93 formed therein between the upper opening 91 and the lower opening 92.

The manifold 90 is formed of a metal, for example, a corrosion-resistant metallic material such as stainless steel, aluminum, or Hastelloy. The processing container 10 and components forming the processing container 10 are formed of, for example, quartz from the viewpoint of preventing metal contamination.

The injector 110 is formed of quartz, and a holder 161 formed of a metal such as Hastelloy is installed below the injector 110. Specifically, a gas flow path 110a is formed in the injector 110, a lower insertion portion 110b is provided at a lower portion of the injector 110, and a fixing portion 110c extending outward in a circumferential direction is provided above the lower insertion portion 110b. In addition, the fixing portion 110c is provided with screw holes 110d into which screws 165 are inserted, respectively.

At an upper portion of the holder 161, a circular recess 161a, into which the lower insertion portion 110b of the injector 110 is inserted, is provided. An annular spring 162 formed of a coil spring is inserted into the recess 161a of the holder 161, and further, the lower insertion portion 110b of the injector 110 is inserted into the recess 161a in a state in which a gas pipe 163 is inserted into the recess 161a. A through-hole 163a serving as a gas flow path is formed in the gas pipe 163, and a portion of the gas pipe 163 is inserted into the gas flow path 110a at the lower portion of the injector 110.

A disc-shaped pressing plate 164 is provided on the fixed portion 110c of the injector 110. The pressing plate 164 has a through-hole 164a, which is formed at the center of the pressing plate 164 and into which the injector 110 is inserted, and screw holes 164b provided around the through-hole 164a. An upper surface 161b of the holder 161 is provided with a plurality of screw holes 161c, and the fixing portion 110c of the injector 110 is fixed by the screws 165 in a state of being sandwiched between the holder 161 above the fixing portion 110c and the pressing plate 164 below the fixing portion 110c.

As described above, the spring 162, the gas pipe 163, and the lower insertion portion 110b of the injector 110 are inserted into the recess 161a of the holder 161, and are fixed by the screws 165 via the pressing plate 164. The holder 161 is inserted into the upper opening 91 of the manifold 90 via a bearing 166, and a fixing portion 161g at a lower portion of the holder 161 passes through an opening in the bearing 166 and the through-hole 93, and exits from the lower opening 92 side. The fixing portion 161g at the lower portion of the holder 161 is a portion to which a first permanent magnet 167 is fixed.

In the present embodiment, the spring 162 is deformed by fastening the screws 165, and the elastic force generates a force to push the injector 110 upward. A gap is formed between the bottom surface of the fixing portion 110c and the upper surface 161b of the holder 161, and an inclination of the injector 110 can be adjusted by the degree of fastening of the plurality of screws 165. For example, when the injector 110 is installed so as to abut against the inner wall of the processing container 10, screws on the inner wall side of the processing container 10 may be tightly fastened and screws on the boat side may be loosely fastened. The pressing plate 164 may be a single plate or may be divided into a plurality of plates.

An opening 161d into which a sleeve 124 for supplying a gas is inserted is provided below the recess 161a of the holder 161. The gas pipe 121 attached to a fixing block 125 is connected to one end of the sleeve 124 via a gasket, and a hole 124a opened upward is formed in the vicinity of the other end of the sleeve 124.

The sleeve 124 is perforated from the one end to the other end. Thus, a processing gas such as a film-forming gas supplied from the gas pipe 121 flows through the interior of the sleeve 124 from the one end to the other end, and goes out upward from the hole 124a in the vicinity of the other end of the sleeve 124. The processing gas going out from the hole 124a in the vicinity of the other end of the sleeve 124 passes through the through-hole 163a in the gas pipe 163 and flows upward through the gas flow path 110a in the injector 110.

The first permanent magnet 167 is inserted into the lower opening 92 of the manifold 90, and the first permanent magnet 167 is fixed to the holder 161 by a screw 168 inserted into a screw hole 161e in the fixing portion 161g at the lower portion of the holder 161. A spacer 169 is provided between the first permanent magnet 167 and the bearing 166. An outer diameter of the spacer 169 is set to be smaller than an inner diameter of the through-hole 93. By disposing the spacer 169 between the bearing 166 and the first permanent magnet 167, gaps are formed between an inner portion (a rotating portion) of the bearing 166 and the bearing support 93a, and between the first permanent magnet 167 and the bearing support 93a, respectively. In addition, a gap is also formed between the bottom surface of the holder 161 and the top surface of an outer portion (fixed portion) of the bearing 166. With such a structure, the injector 110 can be rotated by the rotation of the first permanent magnet 167.

In a method of assembling the internal unit of the gas introduction mechanism of the substrate processing apparatus according to the present embodiment, first, the bearing 166 is installed in the upper opening 91 of the manifold 90. Subsequently, the fixing portion 161g at the lower portion of the holder 161 is inserted into the opening in the bearing 166 and the through-hole 93 from above the bearing 166. Subsequently, the spacer 169 and the first permanent magnet 167 are sequentially inserted into the lower opening 92 of the manifold 90, and the first permanent magnet 167 is fixed to the fixing portion 161g at the lower portion of the holder 161 by the screw 168. Subsequently, the spring 162, the gas pipe 163, and the lower insertion portion 110b of the injector 110 are sequentially inserted into the recess 161a of the holder 161, and the pressing plate 164 is placed on the fixing portion 110c and fixed by the screws 165. Thus, the holder 161 and the injector 110 are secured together. Subsequently, the sleeve 124 for a processing gas is inserted into the manifold 90, the gas pipe 121 is connected to the manifold 90 via a gasket, and the fixing block 125 is screw-fixed. Then, a nitrogen gas pipe 191 is connected to the manifold 90 via a gasket, and a fixing block 192 is screw-fixed. Through the steps described above, the internal unit of the gas introduction mechanism can be assembled.

Next, the external unit of the gas introduction mechanism will be described with reference to FIG. 3, and FIGS. 8 to 10.

The external unit of the gas introduction mechanism is attached to the bottom surface of the manifold 90, and includes a partition block 171, a second permanent magnet 172, a bearing 175, a shaft 177, a pulley 178, and the like.

The bearing 175 is enclosed by an upper bearing case 176a and a lower bearing case 176b. Specifically, the bearing 175 is put into an opening of the upper bearing case 176a and covered by the lower bearing case 176b from below, and the upper bearing case 176a and the lower bearing case 176b are fixed by screws 176c. An opening is provided in central portions of the bearing 175, the upper bearing case 176a, and the lower bearing case 176b, and the shaft 177 is inserted into and installed in this opening.

The shaft 177 is provided with an upper screw hole 177a and a lower screw hole 177b. The second permanent magnet 172 is fixed to an upper portion of the shaft 177 via a spacer 174 by a screw 173 inserted into the upper screw hole 177a of the shaft 177. In addition, the pulley 178 is fixed to a lower portion of the shaft 177 by a screw 179 inserted into the lower screw hole 177b of the shaft 177.

The partition block 171 is provided with a recess 171a at a side opposite the surface attached to the manifold 90, and the partition block 171 and the second permanent magnet 172 are inserted into the recess 171a without being in contact with each other. The partition block 171 and the manifold 90 are fixed by screws 171c in a state in which an O-ring 180 is provided between the partition block 171 and the lower surface of the manifold 90.

In the substrate processing apparatus according to the present embodiment, as illustrated in FIG. 3, a motor 181 for rotating the injector 110 is provided. In addition, a pulley 182 installed on a rotary shaft of the motor 181 and the pulley 178 installed on the shaft 177 are connected by a belt 183. The motor 181 is connected to a motor controller 184 which is a driving controller that controls movement of the motor 181. The motor controller 184 may be included in the controller 150 as a part of the controller 150.

In the present embodiment, when the rotary shaft of the motor 181 rotates under the control of the motor controller 184, the pulley 182 installed on the rotary shaft of the motor 181 rotates. When the pulley 182 rotates, the rotation is transmitted to the pulley 178 via the belt 183, and the pulley 178 rotates. Since the pulley 178 is connected to the second permanent magnet 172 via the shaft 177, when the pulley 178 rotates, the second permanent magnet 172 also rotates at the same time. The first permanent magnet 167 and the second permanent magnet 172 are arranged close to each other, with a partition plate 171b of the partition block 171 interposed therebetween, and the first permanent magnet 167 and the second permanent magnet 172 are magnetically coupled to each other (magnetic coupling). Therefore, when the second permanent magnet 172 rotates, the first permanent magnet 167 magnetically coupled thereto also rotates accordingly. Since both of the first permanent magnet 167 and the injector 110 are fixed to the holder 161, when the first permanent magnet 167 rotates, the injector 110 rotates.

The inside and the outside of the vacuum container are separated from each other by the partition plate 171b of the partition block 171, which is disposed between the first permanent magnet 167 and the second permanent magnet 172. The first permanent magnet 167 is installed inside the vacuum container, and the second permanent magnet 172 is disposed outside the vacuum container.

In the present embodiment, the injector 110 alternately repeats an operation of rotating in one direction and an operation of rotating in the other direction opposite the one direction within a predetermined angle range.

In the present embodiment, the first permanent magnet 167 and the second permanent magnet 172 are formed of magnetized permanent magnets, for example, samarium cobalt magnets or neodymium magnets having strong magnetic forces. The magnetic force of a permanent magnet decreases when the temperature rises. Thus, when the wafers W are heated, the permanent magnets used in the present embodiment may be magnets having a high Curie temperature. Accordingly, the first permanent magnet 167 and the second permanent magnet 172 may be in some embodiments samarium cobalt magnets. In addition, the partition plate 171b of the partition block 171, which is present between the first permanent magnet 167 and the second permanent magnet 172, is formed of a non-magnetic material such as Hastelloy so as not to affect the magnetic coupling of the first permanent magnet 167 and the second permanent magnet 172. In addition, in the present embodiment, the motor 181, the pulley 182, the belt 183, and the like serve as a driving part for rotating the second permanent magnet 172.

Figure 11:
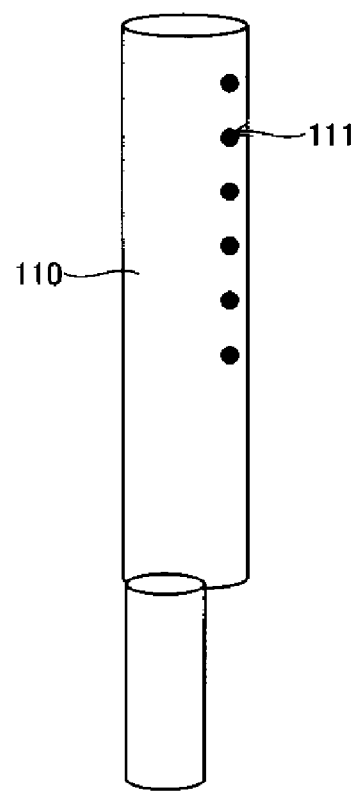
FIG. 11 is a perspective view of another injector of the substrate processing apparatus according to the first embodiment.
Figure 12:
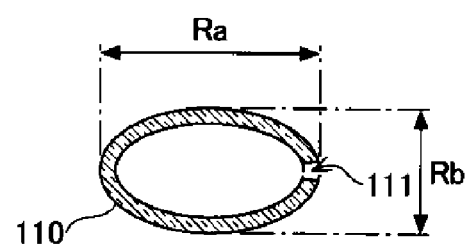
FIG. 12 is a top view of another injector of the substrate processing apparatus according to the first embodiment.

In the foregoing, as illustrated in FIGS. 2A to 2C and the like, the case where the structure of the injector 110 has a circular tubular shape has been described, but the injector 110 may have an elliptically cylindrical shape as illustrated in FIGS. 11 and 12. For example, the injector 110 has a major axis Ra of 30 mm and a minor axis Rb of 20 mm. When the wafers W and the gas holes 111 of the injector 110 are brought close to each other in order to supply a gas from a location near the wafers W, a column of the wafer boat 80 and the injector 110 may collide with each other by the rotation of the wafer boat 80. Therefore, when using the elliptic injector 110 illustrated in FIGS. 11 and 12, it is possible to prevent the column of the wafer boat 80 and the injector 110 from colliding with each other by rotating the injector 110.

In the present embodiment, a nitrogen gas is supplied from the nitrogen gas pipe 191 toward the bearing 166. Accordingly, when the processing gas supplied from the injector 110 is a highly reactive gas, it is possible to prevent the processing gas from entering a region in which the bearing 166 is provided, and thus it is possible to prevent the bearing 166 from being corroded by the processing gas.

In addition, in the above description, the case where the motor 181, the pulley 182, the belt 183, and the like are used as a driving part has been described, but the driving part is not limited thereto. For example, instead of the pulleys 178 and 182 and the belt 183, for example, a gear may be used to rotate the second permanent magnet 172. In addition, for example, a stepping motor may be directly installed below the shaft 177 to rotate the second permanent magnet 172 via the shaft 177 and the like.

(Substrate Processing Method)

Next, a substrate processing method using the substrate processing apparatus according to the present embodiment will be described. When a substrate processing is performed, in a state in which a plurality of, for example, about 50 to 150 sheets of wafers W is placed on the wafer boat 80, the wafer boat 80 is placed on the table 74 on the lid 60. Then, the lid 60 is raised and hermetically sealed, and the wafers W are placed in the processing container 10. Although only one injector 110 is illustrated in FIG. 1, a plurality of injectors 110 (not illustrated) may be provided.

Subsequently, the interior of the processing container 10 is evacuated using the vacuum pump 34 to reach a predetermined pressure.

Subsequently, the wafer boat 80 is rotated and processing gases are supplied from the plurality of injectors 110.

Various processing gases can be selected according to an application. For example, when forming a silicon oxide film, a silicon-containing gas and an oxidizing gas are supplied. The silicon-containing gas may be, for example, aminosilane gas, and the oxidizing gas may be, for example, ozone gas. By reacting the aminosilane gas and ozone gas with each other, silicon oxide is deposited on the wafers W as a reaction product, whereby a silicon oxide film is formed on the wafers W.

Figure 13:
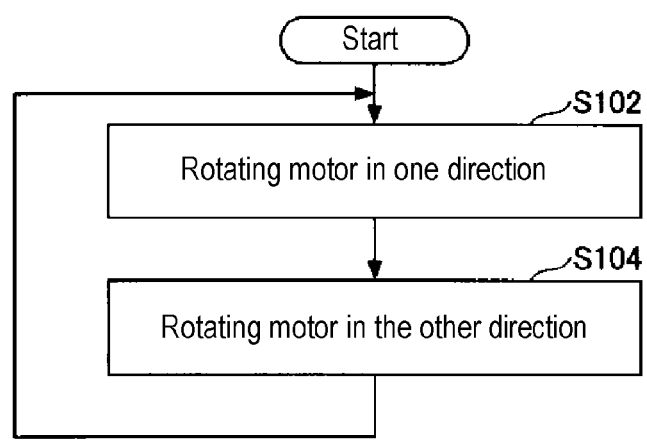
FIG. 13 is a flowchart of a substrate processing method according to the first embodiment.

In the present embodiment, as illustrated in FIG. 13, when the silicon oxide film is formed, the injector 110 is rotated while the rotation direction thereof is alternately changed under the control of the motor controller 184.

Specifically, first, as illustrated in step S102, the motor 181 is rotated in one direction, for example, clockwise. Accordingly, the movement of the motor 181 is transmitted via the pulley 182, the belt 183, and the pulley 178, the holder 161 rotates, and the injector 110 rotates.

Subsequently, as illustrated in step S104, the motor 181 is rotated in the other direction opposite the one direction, for example, counterclockwise. As a result, the movement of the motor 181 is transmitted via the pulley 182, the belt 183, and the pulley 178, the holder 161 rotates, and the injector 110 rotates in a direction opposite that the direction in step S102.

In the present embodiment, step S102 and step S104 are alternately repeated until the formation of the silicon oxide film is completed, whereby the injector 110 is rotated while the rotation direction thereof is alternately changed.

In the present embodiment, in the case of chemical vapor deposition (CVD) film formation, the aminosilane gas and the ozone gas are simultaneously supplied into the processing container 10. On the other hand, in the case of atomic layer deposition (ALD) film formation, first, only the aminosilane gas is supplied into the processing container 10 to be adsorbed onto the surfaces of wafers W. Then, after purging the interior of the processing container 10 using a purge gas, only the ozone gas is supplied and reacts with the aminosilane gas adsorbed onto the surfaces of the wafers W, whereby a silicon oxide film is formed on the surfaces of the wafers W. Then, after supplying the purge gas into the processing container 10, the cycle of supplying the aminosilane gas, supplying the purge gas, supplying the ozone gas, and supplying the purge gas is repeated so as to gradually deposit the silicon oxide film on the surfaces of the wafers W.

In the present embodiment, the number of members required to rotate the injector 110 inside the processing container 10 is smaller than that required when using, for example, an air cylinder. Accordingly, generation of particles can be suppressed. In addition, since it is easy to manufacture the substrate processing apparatus, the substrate processing apparatus can be manufactured at a low cost. Moreover, the substrate processing apparatus can be manufactured in a space-saving manner.

In the present embodiment, the first permanent magnet 167 and the second permanent magnet 172 provided inside and outside the manifold 90, respectively, are magnetically coupled to each other. Thus, when the second permanent magnet 172 rotates, the first permanent magnet 167 also rotates in response thereto, and the injector 110 rotates. Therefore, since no bellows is used, reliability can be improved.

Second Embodiment

Figure 14:
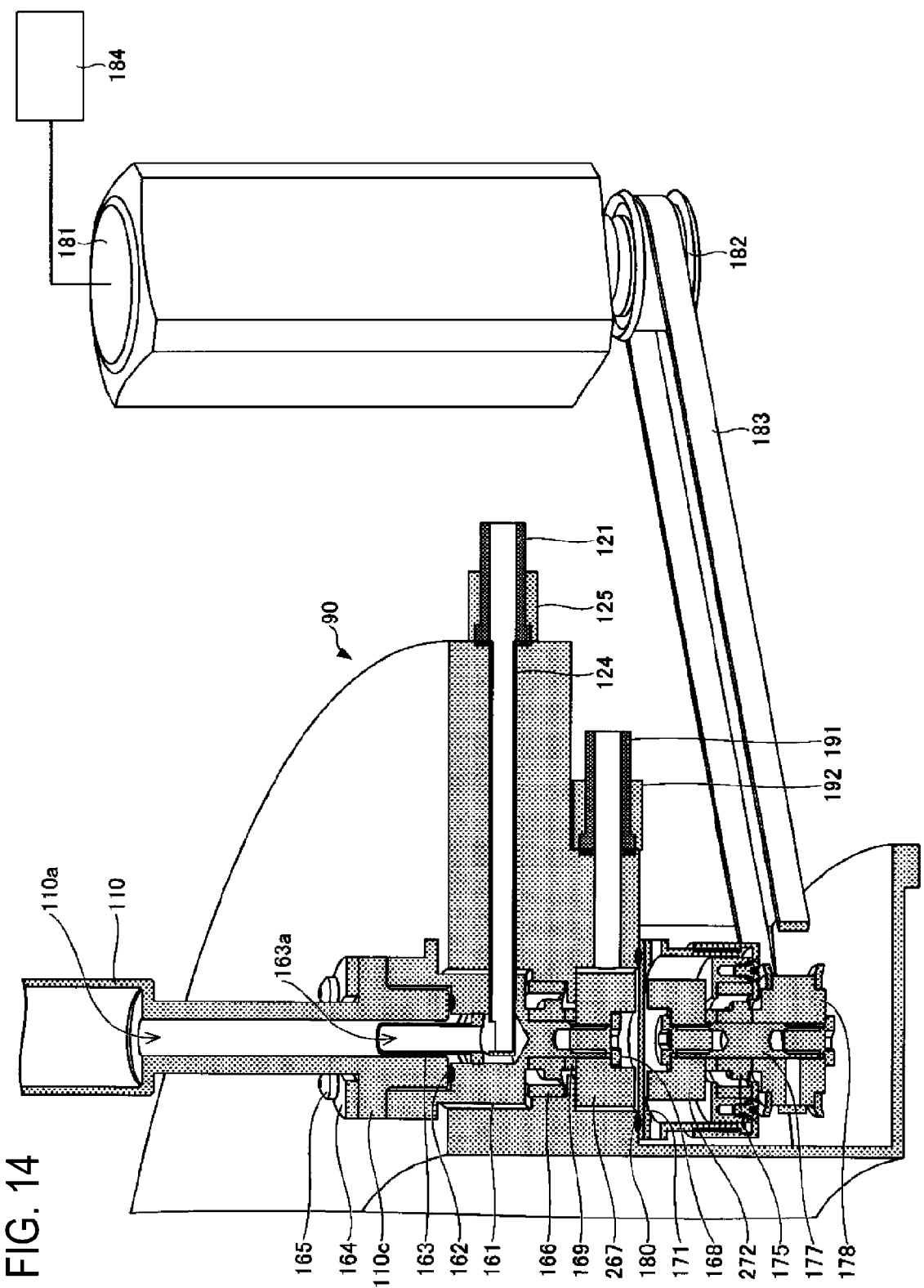
FIG. 14 is an explanatory view of a substrate processing apparatus according to a second embodiment.
Figure 15:
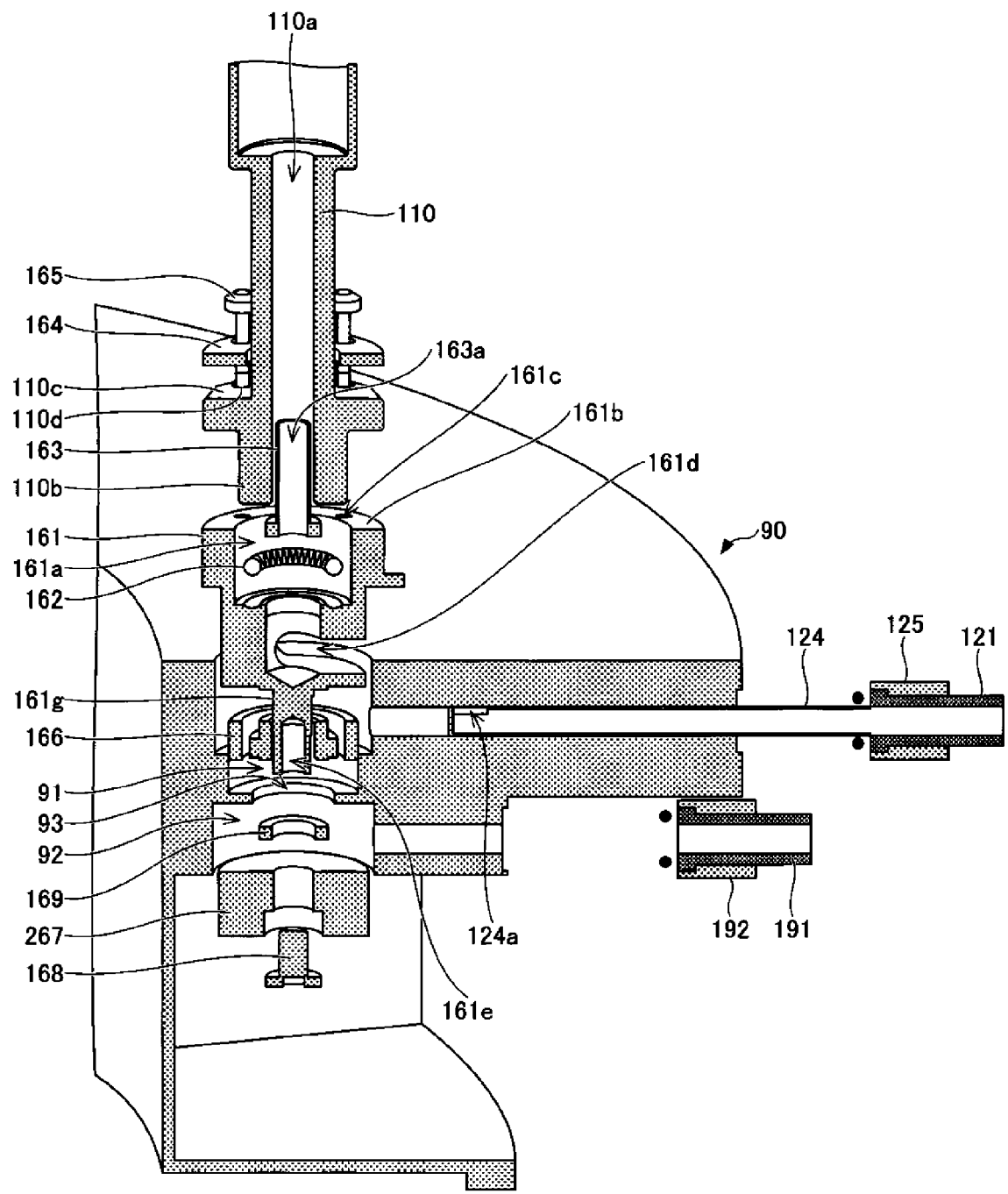
FIG. 15 is an explanatory view of an internal unit of a gas introduction mechanism according to the second embodiment.

Next, a second embodiment will be described. In the present embodiment, a magnetic rotator formed of a magnetic material is used instead of the first permanent magnet. Specifically, as illustrated in FIGS. 14 and 15, a magnetic rotator 267 is inserted in the lower opening 92 of the manifold 90, and the magnetic rotator 267 is fixed to the fixing portion 161g at the lower portion of the holder 161 by the screw 168, with the spacer 169 interposed therebetween. FIG. 14 is a cross-sectional perspective view of the gas introduction mechanism of the substrate processing apparatus in the present embodiment, and FIG. 15 is a cross-sectional perspective view illustrating a state in which the internal unit of the gas introduction mechanism is installed.

In the present embodiment, the magnetic rotator 267 is magnetically coupled to a permanent magnet 272 provided in the external unit of the gas introduction mechanism. Accordingly, by rotating the permanent magnet 272, it is possible to rotate the magnetic rotator 267 and to rotate the injector 110. The permanent magnet 272 in the present embodiment is the same as the second permanent magnet 172 in the first embodiment.

The magnetic rotator 267 may be formed of a ferromagnetic body, and may contain any one of, for example, Fe, Co, and Ni. By using the magnetic rotator formed of a magnetic material instead of the first permanent magnet, it is possible to improve corrosion resistance against the film-forming gas.

The contents other than those described above are the same as those in the first embodiment.

In the above embodiments, the case where a predetermined film is formed on the wafers W has been described as an example, but the present disclosure is not limited thereto. The present disclosure is also applicable to, for example, a process in which a film-forming step of supplying a film-forming gas to the wafers W to form a predetermined film on the wafers W, and an etching step of supplying an etching gas to etch the predetermined film are repeated.

According to the substrate processing apparatus disclosed herein, it is possible to suppress generation of particles when the injector is rotated.

While certain embodiments have been described, these embodiments have been presented by way of example only, and are not intended to limit the scope of the disclosures. Indeed, the embodiments described herein may be embodied in a variety of other forms. Furthermore, various omissions, substitutions and changes in the form of the embodiments described herein may be made without departing from the spirit of the disclosures. The accompanying claims and their equivalents are intended to cover such forms or modifications as would fall within the scope and spirit of the disclosures.

What is claimed is:

1. A substrate processing apparatus comprising:
   a processing container;
   an injector provided inside the processing container and having a shape extending in a longitudinal direction along which a processing gas is supplied;
   a holder disposed inside the processing container and fixed to the injector;
   a first magnet fixed to the holder and disposed inside the processing container;
   a partition plate separating an inside and an outside of the processing container from each other;
   a second magnet separated from the first magnet by the partition plate and disposed outside the processing container; and
   a driving part configured to rotate the second magnet,
   wherein the first magnet and the second magnet are magnetically coupled to each other, and
   wherein by rotating the second magnet by the driving part, the first magnet magnetically coupled to the second magnet is rotated, and the injector rotates about the longitudinal direction as an axis.

2. The substrate processing apparatus of claim 1, further comprising a driving controller configured to control the driving part,
   wherein the driving controller performs a control to alternately perform rotating the second magnet in a first direction and rotating the second magnet in a second direction opposite the first direction.

3. The substrate processing apparatus of claim 2, wherein the first magnet is a magnetic rotator formed of a magnetic material.

4. The substrate processing apparatus of claim 1, wherein the first magnet is a magnetic rotator formed of a magnetic material.

5. A substrate processing method using a substrate processing apparatus including: a processing container; an injector provided inside the processing container and having a shape extending in a longitudinal direction along which a processing gas is supplied; a holder disposed inside the processing container and fixed to the injector; a first magnet fixed to the holder and disposed inside the processing container; a partition plate separating an inside and an outside of the processing container from each other; a second magnet separated from the first magnet by the partition plate and disposed outside the processing container; and a driving part configured to rotate the second magnet, the first magnet and the second magnet being magnetically coupled to each other, and in a state in which the processing gas is supplied into the processing container from the injector, the method comprising:
   rotating the second magnet by the driving part such that the injector rotates in a first direction; and
   rotating the second magnet by the driving part such that the injector rotates in a second direction opposite the first direction.

6. The substrate processing method of claim 5, wherein the first magnet is a magnetic rotator formed of a magnetic material.

* * * * *